(12) United States Patent
Yamazaki

(10) Patent No.: US 7,710,133 B2
(45) Date of Patent: May 4, 2010

(54) TESTING METHOD FOR SEMICONDUCTOR DEVICE HAVING BALL-SHAPED EXTERNAL ELECTRODE

(75) Inventor: Toshihiko Yamazaki, Tsurugashima (JP)

(73) Assignee: Toko, Inc., Tokyo (JP)

( * ) Notice: Subject to any disclaimer, the term of this patent is extended or adjusted under 35 U.S.C. 154(b) by 0 days.

(21) Appl. No.: 12/154,196

(22) Filed: May 21, 2008

(65) Prior Publication Data
US 2008/0290887 A1 Nov. 27, 2008

(30) Foreign Application Priority Data
May 25, 2007 (JP) .............................. 2007-138760

(51) Int. Cl.
*G01R 31/02* (2006.01)
(52) U.S. Cl. .................................... 324/754; 324/158.1
(58) Field of Classification Search ......... 324/754–765, 324/158.1
See application file for complete search history.

(56) References Cited

U.S. PATENT DOCUMENTS

| 5,641,945 | A  | * | 6/1997  | Abe et al. ..................... | 174/261 |
| 7,078,921 | B2 | * | 7/2006  | Haga et al. ................... | 324/754 |
| 7,271,606 | B1 | * | 9/2007  | Tang et al. ................... | 324/761 |
| 2003/0090280 | A1 | * | 5/2003  | Maekawa et al. ........... | 324/754 |
| 2003/0102878 | A1 | * | 6/2003  | Montoya ..................... | 324/754 |
| 2003/0141883 | A1 | * | 7/2003  | Mitchell et al. ............. | 324/754 |
| 2004/0239352 | A1 | * | 12/2004 | Mizoguchi .................. | 324/754 |
| 2007/0296433 | A1 | * | 12/2007 | Gritters ....................... | 324/757 |

FOREIGN PATENT DOCUMENTS

| JP | 11-064385   | 3/1999  |
| JP | 2003-270267 | 9/2003  |
| JP | 2004-335613 | 11/2004 |
| JP | 2005-283359 | 10/2005 |

* cited by examiner

*Primary Examiner*—Ha Tran T Nguyen
*Assistant Examiner*—Richard Isla Rodas
(74) *Attorney, Agent, or Firm*—Cohen Pontani Lieberman & Pavane LLP

(57) ABSTRACT

Disclosed is a method of testing electrical characteristics of a semiconductor device having a ball-shaped external electrode. The method comprises preparing a plurality of cantilever-type contactors each supported by a support plate at a given position, and formed in such a manner that a tip thereof has a flat surface with an arc-shaped edge in an outer peripheral region thereof, and a cross-sectional diameter in a vicinity of the tip is greater than a radius of the ball-shaped external electrode, and pairing the cantilever-type contactors to provide paired two contactors. The method includes the steps of: pressing either one of the support plate and the semiconductor device toward the other in such a manner that the arc-shaped edges of the paired two contactors are brought into contact with respective ones of two surface regions of the ball-shaped external electrode divided by an axis of the ball-shaped external electrode passing through a middle point between the two positions where the paired two contactors are supported, so as to form Kelvin contacts; and further overly driving either one of the support plate and the semiconductor device relative to the other in such a manner that the arc-shaped edges of the paired two contactors are slidingly moved along respective ones of the two surface regions of the ball-shaped external electrode to perform a wiping operation.

8 Claims, 6 Drawing Sheets

FIG. 7
(a)
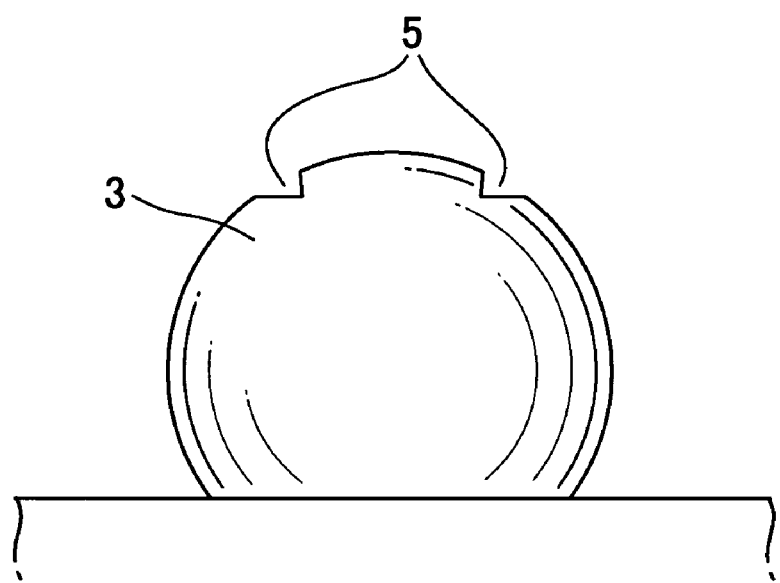
(b)
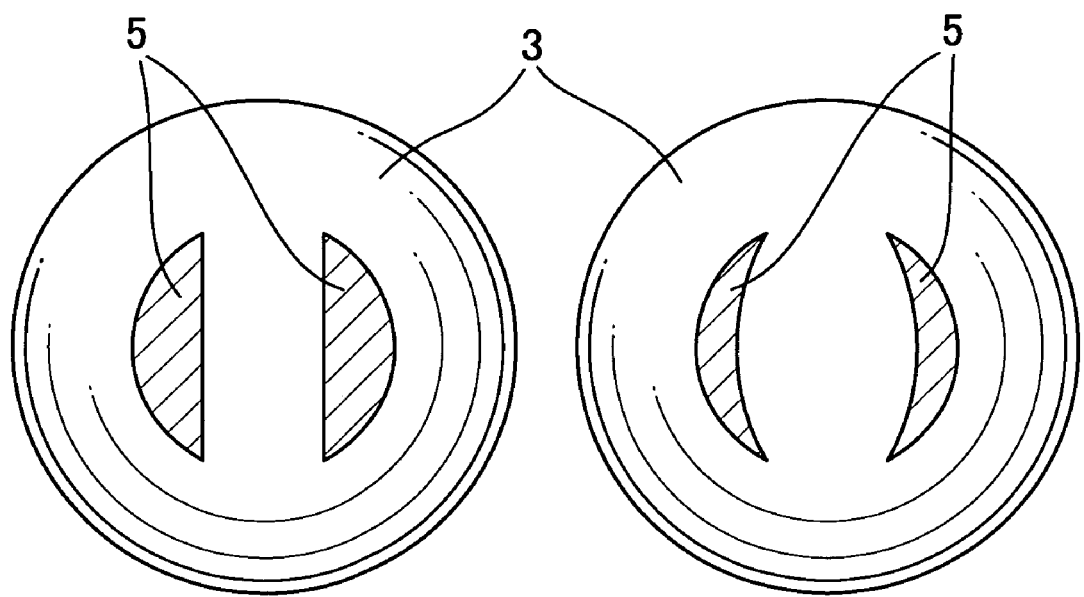

ELECTRODE

TESTING METHOD FOR SEMICONDUCTOR DEVICE HAVING BALL-SHAPED EXTERNAL ELECTRODE

BACKGROUND OF THE INVENTION

1. Field of the Invention

The present invention relates to electrical characteristic testing of a semiconductor device, such as a BGA (Ball Grid Array), a CSP (Chip Size Package), a WLCSP (Wafer Level Chip Size Package) or a flip chip, which has a ball-shaped external terminal.

2. Description of the Prior Art

Heretofore, a Kelvin contact measurement has been known as a technique for testing electrical characteristics with a high degree of accuracy. The Kelvin contact measurement is performed under a condition that two contactors connected to respective ones of a sense terminal and a force terminal of a measuring apparatus are in contact with one external electrode of a semiconductor device (i.e., Kelvin contacts). The Kelvin contact measurement is capable of cancelling influences of a contact resistance and a residual resistance of a measurement cable to provide extremely high measurement accuracy.

In an operation of testing a semiconductor device based on the Kelvin contact measurement, a cantilever-type contactor is commonly used. FIG. 1 shows the structure of a conventional cantilever-type contactor. As shown in FIG. 1, the cantilever-type contactor 11 has a beam portion 11a and a probe portion 11b. The contactor 11 is supported by a support plate of a probe card or the like, through one end of the beam portion 11a. The support plate is adapted to be moved in an upward/downward direction in such a manner as to allow the probe portion 11b to be brought into contact with an external electrode of the semiconductor device in conjunction with the movement so as to measure electrical characteristics of the semiconductor device. A testing method based on the Kelvin contact measurement using such a cantilever-type contactor is disclosed, for example, in JP 2003-270267A.

The cantilever-type contactor has a feature of being able to facilitate a wiping operation. Specifically, an oxide film or a contaminant is likely to be formed or attach on a surface of the external electrode (made of metal) and intervene between the contactor and the external electrode, to cause difficulty in accurately performing the measurement if nothing is done. Thus, it is critical to perform the wiping operation, i.e., an operation of removing the intervening substance, such as an oxide film, from the surface of the external electrode, so as to expose the original metal surface of the external electrode, in advance of the measurement.

Recent years, along with complexification in configuration of a semiconductor device for meeting needs for higher-speed operation and larger capacity, a semiconductor device (e.g., BGA or CSP) having a ball-shaped external electrode (hereinafter referred to as "bump ball"), instead of conventional types, such as a lead terminal and an electrode pad, has been increasingly used. If such a semiconductor device having a bump ball is subjected to the testing method using the above conventional cantilever-type contactor, the following problems will occur.

FIG. 2 is a schematic diagram showing a contact state between the conventional cantilever-type contactor and one bump ball. As shown in FIG. 2, the conventional cantilever-type contactor 11 has a tip end P which is fairly thinner and weaker than the bump ball 13. Specifically, the bump ball 13 has a diameter of about 100 μm, whereas the tip end P of the cantilever-type contactor 11 typically has a thickness of about 10 to 50 μm. Thus, during a process of bringing the cantilever-type contactor 11 into contact with the bump ball 13, the tip end P is likely to be deformed. In some cases, the tip end P slips off a surface of the bump ball 13 to preclude a stable contact with the bump ball 13. In some cases, the tip end P deeply sticks into the bump ball 13 to seriously damage the bump ball 13. Considering these problems, it is difficult to use the conventional cantilever-type contactor for testing of a semiconductor device having a bump ball.

For this reason, a POGO pin-type contactor has been used mainly in the electrical characteristic testing of a semiconductor device having a bump ball. FIG. 3 shows a testing method using a typical POGO pin-type contactor. The POGO pin-type contactor illustrated in FIG. 3 comprises a plunger 26 and a body member 27. A coil spring 28 is arranged inside the body member 27 in such a manner as to allow the plunger 26 to be brought into contact with one bump ball 23, with a spring load depending on elongation or contraction of the coil spring 28, and electrically connected to the bump ball 23.

However, it is hard to perform the wiping operation using the POGO pin-type contactor illustrated in FIG. 3, and thereby it is difficult to achieve a high-accuracy measurement. Moreover, dusts are likely to be trapped in notches or depressions in a measurement portion (indicated by an elliptic area in FIG. 3) of the plunger 26, and the trapped dusts are hardly removed from the depressions. The difficulty in removing the dusts is likely to cause the occurrence of defects, such as contact failure, and preclude long-term use of the contactor. In addition, in connection with recent progress in integration of a semiconductor device, a bump ball has been increasingly reduced in size. Thus, in an operation of testing electrical characteristics of a semiconductor device having such a small-sized bump ball based on the Kelvin contact measurement, it is extremely difficult to allow two POGO pin-type contactors to be brought into contact with one bump ball. This makes it difficult for the POGO pin-type contactor to achieve a high-accuracy measurement in a simple manner.

SUMMARY OF THE INVENTION

In view of the above circumstances, it is a first object of the present invention to provide a testing method capable of reliably achieving a wiping operation, in advance of electrical characteristic testing of a semiconductor having a bump ball. It is a second object of the present invention to provide a testing method capable of reliably forming Kelvin contacts, during electrical characteristic testing of a semiconductor having a bump ball.

In order to achieve the above objects, the present invention provides a method of testing electrical characteristics of a semiconductor device having a ball-shaped external electrode. The method comprises preparing a plurality of cantilever-type contactors each including a beam portion supported by a support plate at a given position of the support plate, and a probe portion formed in such a manner that a tip thereof has a flat surface with an arc-shaped edge in an outer peripheral region thereof, and a cross-sectional diameter in a vicinity of the tip is greater than a radius of the ball-shaped external electrode, and pairing the cantilever-type contactors to provide paired two contactors. The method includes the step of pressing either one of the support plate and the semiconductor device toward the other in such a manner that the arc-shaped edges of the paired two contactors are brought into contact with respective ones of two surface regions of the ball-shaped external electrode divided by an axis of the ball-shaped external electrode passing through a middle point between the two positions where the paired two contactors are supported. The method further includes the step of further overly driving either one of the support plate and the semiconductor device relative to the other in such a manner that the arc-shaped edges of the paired two contactors are slidingly moved along respective ones of the two surface regions of the ball-shaped external electrode to perform a wiping operation.

Specifically, in the method of testing electrical characteristics of a semiconductor device having a ball-shaped external electrode, according to the present invention, each of a plurality of cantilever-type contactors has a probe portion formed in such a manner that a tip thereof is subjected to grinding so as to have a flat surface with an arc-shaped edge in an outer peripheral region thereof, and a cross-sectional diameter in a vicinity of the tip is greater than a radius of the ball-shaped external electrode.

Then, the cantilever-type contactors are fixed to a support plate in such a manner that paired ones of the contactors to be brought into contact with the ball-shaped external electrode in two-to-one relationship. Then, in response to pressing the support plate toward the semiconductor device (or pressing the semiconductor device toward the support plate), the paired two contactors are brought into contact with the ball-shaped external electrode to form Kelvin contacts. Further, in response to overly driving the support plate (or the semiconductor device), the arc-shaped edges of the paired two contactors perform a wiping operation. Through the wiping operation, an original surface of the ball-shaped external electrode (made of metal) is partially exposed to allow the arc-shaped edges of the paired two contactors to be electrically connected to the exposed portions.

One of the paired two contactors and the other contactor are connected to respective ones of a sense terminal and a force terminal to perform electrical characteristic testing of the semiconductor device based on a Kelvin contact measurement.

As above, the method of testing electrical characteristics of a semiconductor device having a ball-shaped external electrode, according to the present invention, makes it possible to reliably achieve a wiping operation so as to perform a Kelvin contact measurement with a high degree of accuracy. In addition, the method of the present invention allows the contactor to have enhanced durable and longer usable period.

BRIEF DESCRIPTION OF THE DRAWINGS

FIGS. 7(a) and 7(b) illustrate a wiping trace formed in the ball-shaped external electrode after the contact with the paired two contactors for use in the method of the present invention, wherein FIGS. 7(a) and 7(a) are a front view and a top view of the ball-shaped external electrode, respectively.

DESCRIPTION OF THE PREFERRED EMBODIMENTS

With reference to the drawings, an embodiment of the present invention will now be described. The following description about this embodiment will be made based on one example where a semiconductor device comprises a plurality of ball-shaped external electrodes (hereinafter referred to as "bump balls") each formed to have a diameter 2R of 390 μm, and arranged at intervals of 800 μm.

Figure 1:
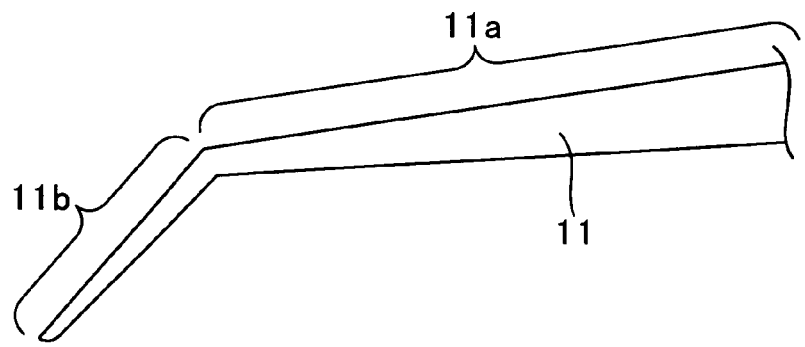
FIG. 1 is a schematic diagram showing a conventional cantilever-type contactor.
Figure 2:
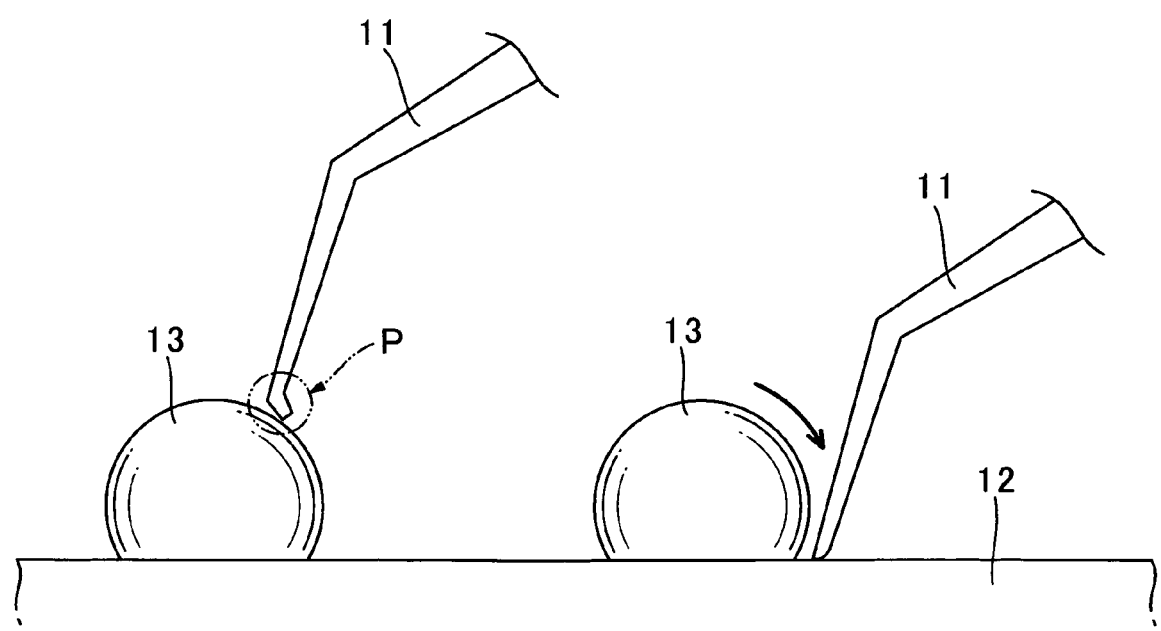
FIG. 2 is an explanatory diagram showing a contact between the conventional cantilever-type contactor and a ball-shaped external electrode.
Figure 3:
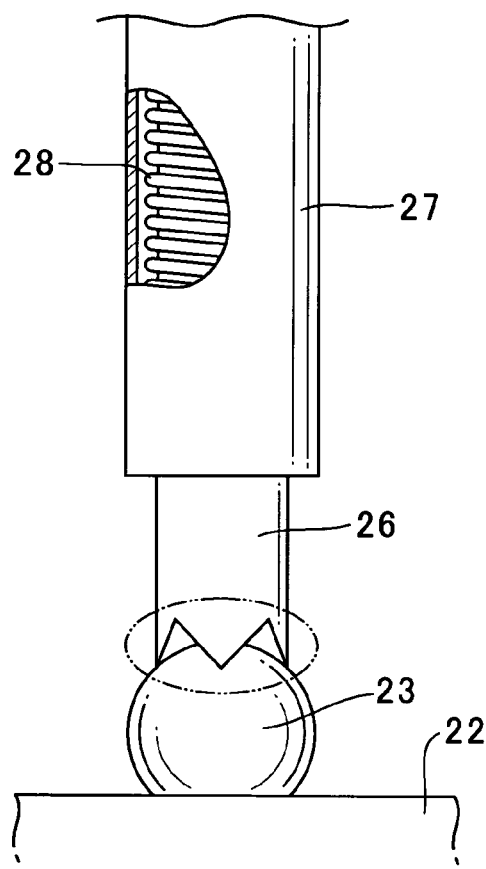
FIG. 3 is an explanatory diagram showing a testing method using a typical POGO pin-type contactor.
Figure 4:
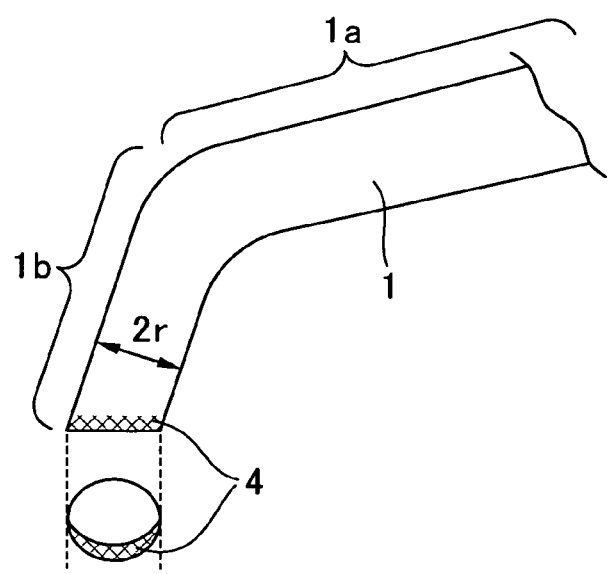
FIG. 4 is a side view showing a contactor for use in a testing method of the present invention, together with a bottom view thereof.

First of all, a contactor for use in a testing method of the present invention will be described. FIG. 4 is a side view showing the contactor for use in the testing method of the present invention. As shown in FIG. 4, a cantilever-type contactor 1 is used in the testing method of the present invention. The contactor 1 has a beam portion 1a and a probe portion 1b. The probe portion 1b is formed to have a sectional diameter 2r greater than a radius R of a bump ball, in a vicinity of a tip thereof. In this embodiment, the sectional diameter 2r is set at 280 μm. The tip of the probe portion 1b is subjected to grinding so as to have a flat surface with an arc-shaped edge 4 formed in an outer peripheral region (i.e., the shaded region in FIG. 4) thereof.

Figure 5:
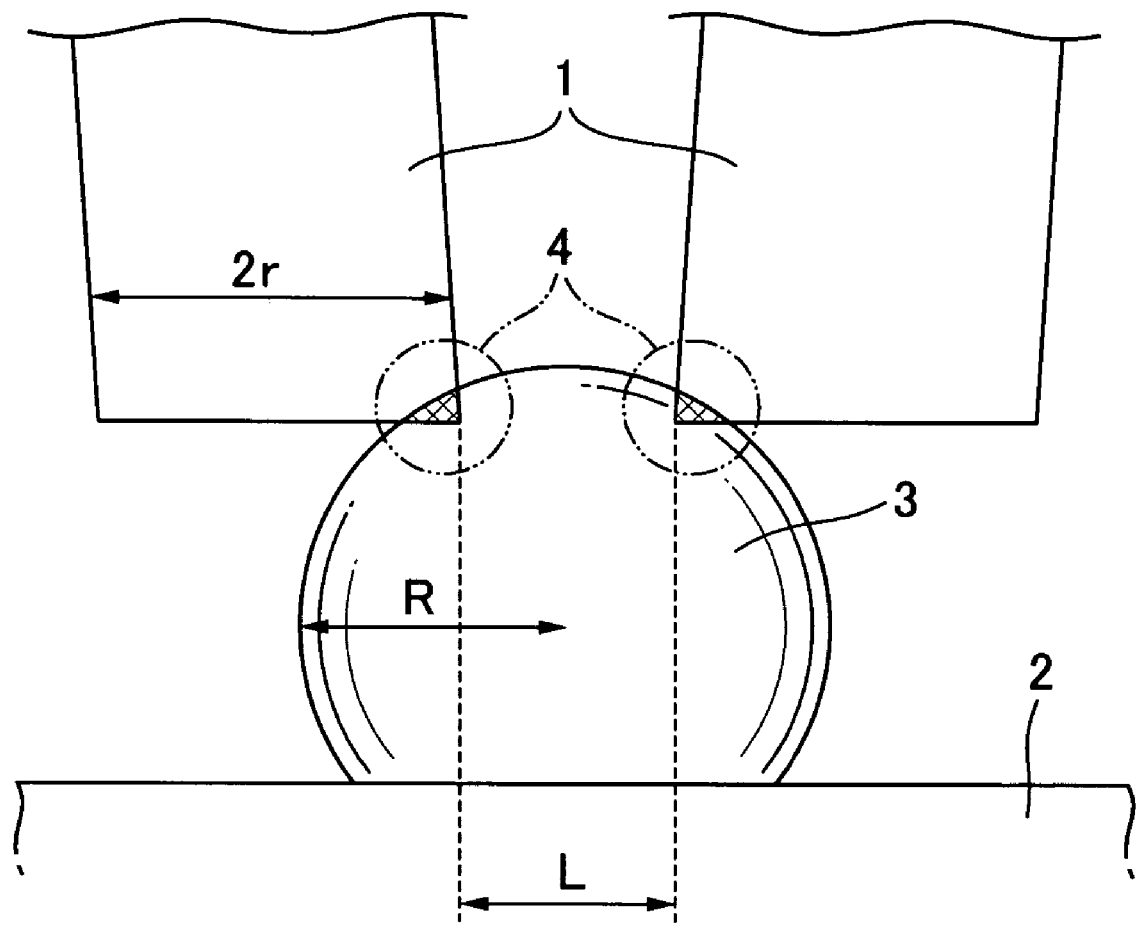
FIG. 5 is an explanatory front view showing a contact between a ball-shaped external electrode and each of paired two contactors for use in the method of the present invention.

With reference to FIG. 5 to FIG. 7(b), a process of the testing method of the present invention will be described below. FIG. 5 is an explanatory front view showing a contact between the bump ball and each of paired two contactors for use in the method of the present invention.

The beam portion 1a of each of the paired two contactors 1 is supported by a support plate of a probe card or the like, at a given position of the support plate. These positions are adjusted to allow the paired two contactors to be brought into contact with a common one of the bump balls (i.e., in two-to-one relationship), as will be specifically described later.

In response to a pressing force applied to the support plate toward the semiconductor device 2, the paired two contactors 1 are gradually moved close to the semiconductor device 2. When the pressing force is continuously applied, the respective arc-shaped edges 4 of the paired two contactors 1 are brought into contact with a surface of the bump ball 3. In this embodiment, a distance L between the paired two contactors 1 is set at about 90 μm. Alternatively, the distance L may be set at any other suitable value allowing the paired two contactors 1 to be brought into contact with the bump ball 3 without a contact between the paired two contactors 1. Further, instead of applying a pressing force to the support plate, the pressing force may be applied to the semiconductor device so as to allow the paired two contactors 1 to be brought into contact with the bump ball 3.

Figure 6:
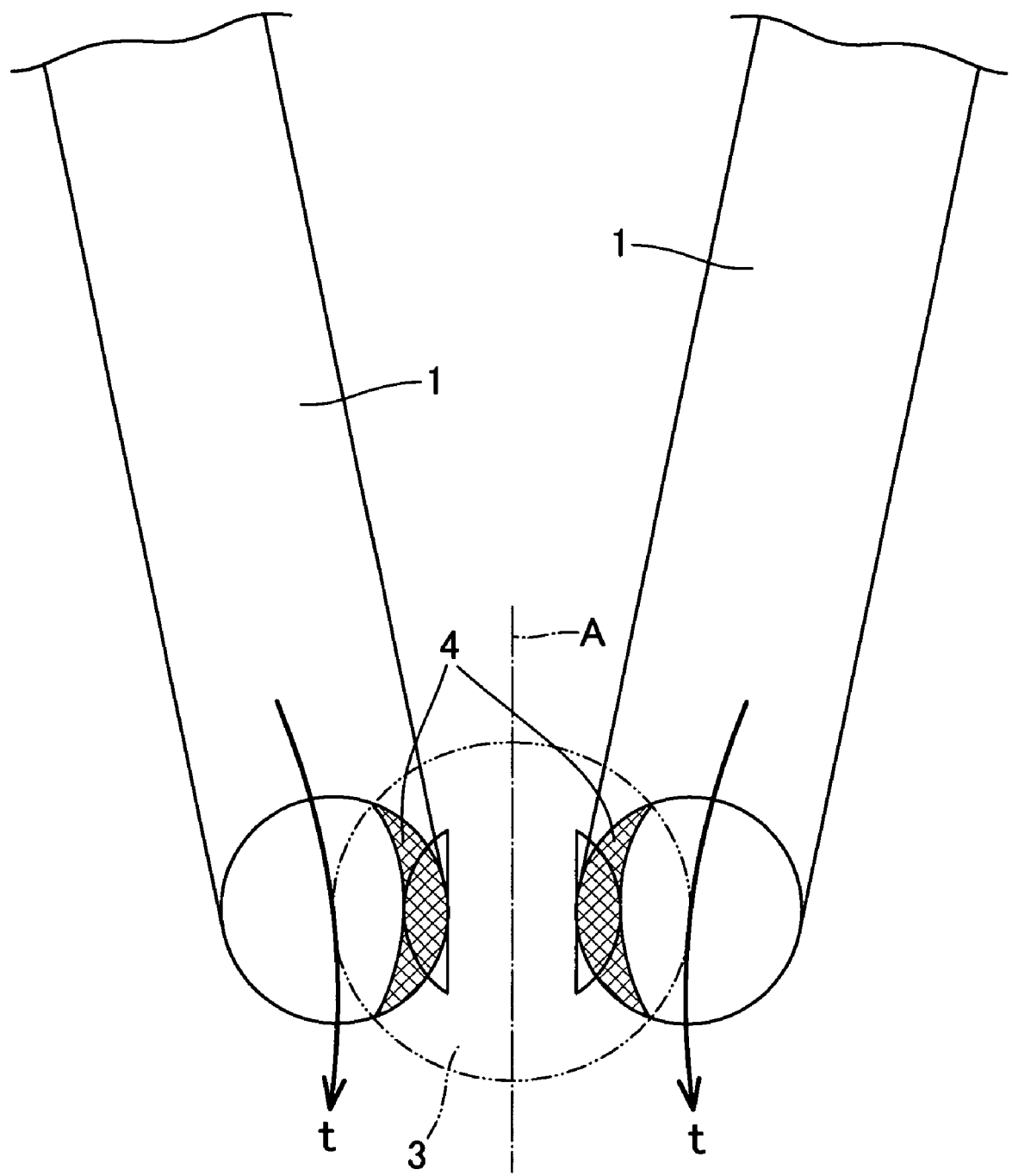
FIG. 6 is an explanatory top view showing a wiping operation and a contact mechanism of the paired two contactors for use in the method of the present invention.

The following description will be made about respective contact positions of the paired two contactors 1 with the bump ball 3. FIG. 6 is an explanatory top view showing a wiping operation and a contact mechanism of the paired two contactors for use in the method of the present invention. The line A illustrated in FIG. 6 is an axis of the bump ball 3 passing through a middle point between the two positions at which the paired two contactors 1 are supported by the support plate. Given that the surface of the bump ball 3 is divided into two surface regions by the axis A, the arc-shaped edges 4 are disposed to be brought into contact with respective ones of the two surface regions. Preferably, the paired two contactors 1 are supported to define a certain angle therebetween (i.e., in non-parallel relation to each other) as shown in FIG. 6, instead of being supported in parallel relation to each other.

In response to the pressing force applied to the support plate toward the semiconductor device, the arc-shaped edges 4 of the paired two contactors 1 are brought into contact with the bump ball 3. Then, when the support plate is further overly driven, the respective beam portions 1a of the paired two contactors 1 are bent, and each of the arc-shaped edges 4 is moved in a longitudinal direction of a corresponding one of the beam portions 1a. Thus, according to an interaction between the arc-shaped edge 4 and a corresponding one of the curved surface regions of the bump ball 3, the arc-shaped edge 4 is slidingly moved along the surface region of the bump ball 3 while following a locus as indicated by the arrowed curve "t" in FIG. 6. During this movement, the surface regions of the bump ball 3 are wiped by respective ones of the arc-shaped edges 4 of the paired two contactors 1.

Thus, the paired two contactors 1 are electrically connected to the bump ball 3 while wiping respective ones of the surface regions of the bump ball 3, without a contact therebetween. In addition, the paired two contactors 1 are brought into contact with a common one of the bump balls 3 at different positions, respectively. Thus, one of the paired two contactors 1 and the other contactor can be connected to respective ones of a sense terminal and a force terminal of a measuring apparatus to perform a Kelvin contact measurement.

FIGS. 7(a) and 7(b) illustrate a wiping trace formed in the bump ball after the contact with the paired two contactors. As seen in FIG. 7(a) which is a front view of the bump ball, two wiping traces 5 are shallowly formed in the surface of the bump ball 3. The reason is that the sectional diameter 2r of each of the paired two contactors 1 is set at a relatively large value allowing a pressing force of the contactor 1 to be adequately distributed, so that the contactor 1 can moderately wipe the bump ball 3 without seriously damaging the bump ball 3. As seen in FIG. 7(b) which is a top view of the bump ball, two half-moon-shaped or crescent-shaped traces 5 are formed in a symmetrical pattern. The reason is that each of the paired two contactors 1 is slidingly moved along the surface region of the bump ball 3 while following a locus as indicated by the arrowed curve "t". The difference in shape, such as a half-moon shape and a crescent shape, arises from a difference in pressing force of the contactor 1.

In the conventional testing method, dusts created by the wiping operation or the like are accumulated between paired two contactors during repetition of the testing, to cause measurement errors. Thus, the conventional testing method is required to clean the tips of the paired two contactors through grinding or the like. In the testing method of the present invention, the distance between the paired two contactors 1 is changed (in a rightward/leftward direction in FIG. 6) in conjunction with the wiping movement following the arrowed curve "t". This change in the distance between the paired two contactors 1, and a smoothly curved surface in the vicinity of the tip of each of the paired two contactors 1, can prevent accumulation of dusts. Thus, measurement errors due to accumulated dusts are less likely to occur even after repetition of the testing, so that a maintenance operation, such as grinding, may be performed only for re-forming the arc-shaped edge of the contactor, i.e., a frequency of the maintenance operations may be significantly reduced as compared with the conventional testing method. The grinding is one of the negative factors causing shortening of a usable period of the contactor. On this point, the contactor 1 for use in the present invention has a longer usable period than that of the conventional contactor.

Figure 8:
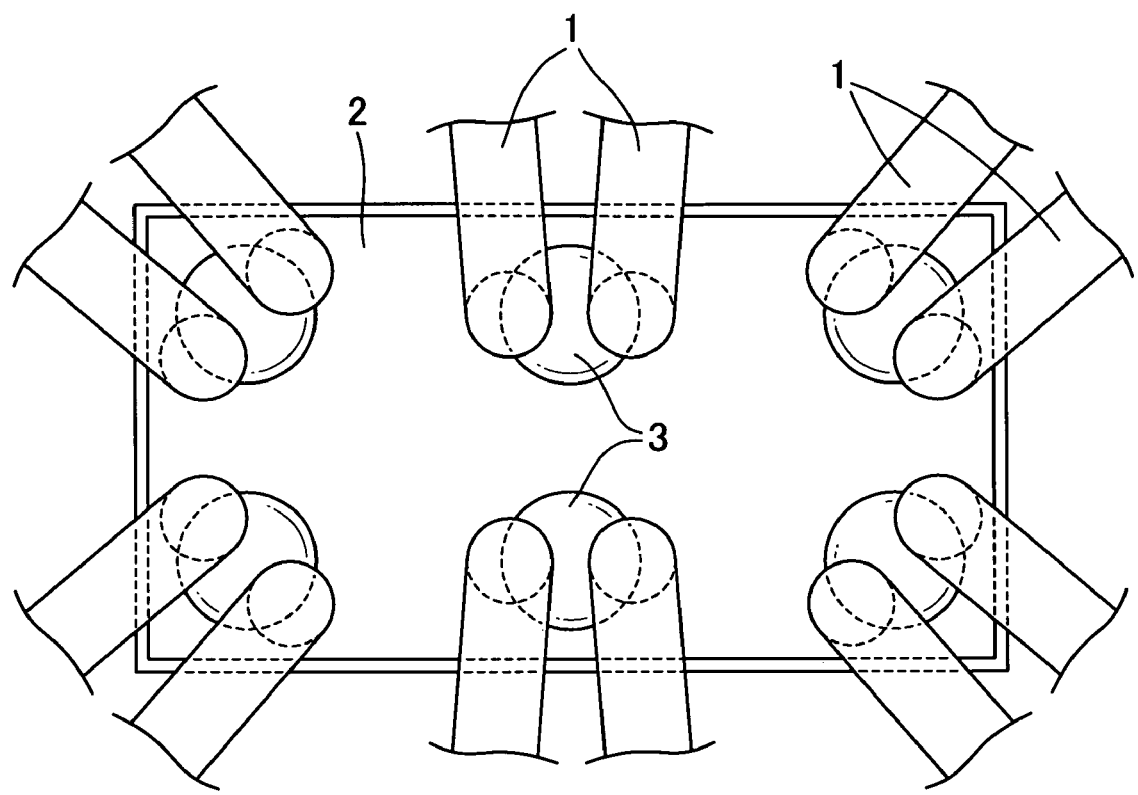
FIG. 8 is a schematic diagram showing one example of a contact state during testing of a semiconductor in the method of the present invention.

FIG. 8 is a schematic diagram showing one example of a contact state during testing of a semiconductor in the method of the present invention. In this example, twelve contactors 1 are fixed to a support plate while adjusting respective positions of the contactors 1 in such a manner as to allows paired ones of the contactors 1 to be brought into contact with a common one of six bump balls 3 of a semiconductor 2, in a radial arrangement about a center of the semiconductor 2. While twelve contactors 1 are used in this example, the number of contactors may be selectively determined depending on the number of external electrodes and/or the need for Kelvin contacts. In response to a pressing force applied to the support plate toward the semiconductor device, each of the contactors 1 is brought into contact with a corresponding one of the bump balls to form Kelvin contacts, while wiping the bump ball in a direction from an outward side to an inward side of the semiconductor device. This makes it possible to test electrical characteristics of a semiconductor device having a bump ball, with a high degree of accuracy in a simple manner.

What is claimed is:

1. A method of testing electrical characteristics of a semiconductor device having a ball-shaped external electrode on a rear surface thereof, said method comprising:
    preparing a plurality of cantilever-type contactors each including:
        a flexible beam portion supported by a support plate at a given position of said support plate, and
        a probe portion extending in a direction away from a longitudinal direction of said beam portion and having a tip, said tip having a flat end surface and an arc-shaped edge in the form of a smoothly curved surface extending from the flat end surface to an outer peripheral region of the probe portion, and
        a cross-sectional diameter in a vicinity of said tip being greater than a radius of said ball-shaped external electrode,
    pairing said cantilever-type contactors so that the respective tips of the paired contactors are in contact with said ball-shaped external electrode during testing;
    bringing at least one of said support plate and said semiconductor device toward the other so that said arc-shaped edges of said paired contactors are in contact with respective surface regions of said ball-shaped external electrode divided by an axis of said ball-shaped external electrode passing through a middle point between said two positions where said paired contactors are supported; and
    driving at least one of said support plate and said semiconductor device relative to the other so that both of said arc-shaped edges of said paired contactors are slidingly moved in a same direction that the rear surface of said semiconductor device extends along respective surface regions of said ball-shaped external electrode, whereby said flexible beam portions of said paired contactors flex to perform a wiping operation.

2. The method as defined in claim 1, wherein said paired contactors are supported by said support plate in such a manner that said respective beam portions thereof are disposed in a non-parallel relation to each other.

3. A method of testing electrical characteristics of a semiconductor device having a ball-shaped external electrode, said method comprising:
    providing a plurality of cantilever-type contactors each including:
        a flexible beam portion supported by a support plate; and
        a probe portion extending from said beam portion and having a tip portion, said tip portion having a flat end surface and an arc-shaped edge extending from the flat end surface to an outer peripheral region of the probe portion;

pairing said cantilever-type contactors so that the respective tips of the paired contactors are in contact with said ball-shaped external electrode during testing;

bringing said arc-shaped edges of said paired contactors into contact with respective surface regions of said ball-shaped external electrode; and slidingly moving said paired contactors and said ball-shaped external electrode relative to each other, whereby said arc-shaped edges perform a wiping operation of said ball-shaped external electrode.

4. The method as defined in claim 3, wherein the step of slidingly moving said paired contactors and said ball-shaped external electrode is carried out along said respective surface regions of said ball-shaped external electrode.

5. The method as defined in claim 3, wherein the step of slidingly moving said paired contactors and said ball-shaped external electrode is carried out parallel to a rear surface of said semiconductor device.

6. The method as defined in claim 3, wherein the beam portions of said paired contactors flex to perform the wiping operation.

7. The method as defined in claim 3, wherein the probe portions are bent in relation to the respective beam portions.

8. The method as defined in claim 3, a cross-sectional diameter in a vicinity of said tip is greater than a radius of said ball-shaped external electrode.

* * * * *

UNITED STATES PATENT AND TRADEMARK OFFICE
CERTIFICATE OF CORRECTION

PATENT NO.       : 7,710,133 B2
APPLICATION NO.  : 12/154196
DATED            : May 4, 2010
INVENTOR(S)      : Toshihiko Yamazaki It is certified that error appears in the above-identified patent and that said Letters Patent is hereby corrected as shown below:

TITLE PAGE, ITEM (73), should read,

--(73) ~~Toko, Inc.,~~ <u>Asahi Kasei Toko Power Devices Corporation,</u> Tokyo, (JP)--

Signed and Sealed this
Twenty-second Day of March, 2011

David J. Kappos
*Director of the United States Patent and Trademark Office*